US005691660A

United States Patent [19]
Busch et al.

[11] Patent Number: 5,691,660
[45] Date of Patent: Nov. 25, 1997

[54] CLOCK SYNCHRONIZATION SCHEME FOR FRACTIONAL MULTIPLICATION SYSTEMS

[75] Inventors: Robert Edward Busch, Essex Junction, Vt.; Kenneth Michael Zick, Dallas, Tex.; Robert Maurice Houle, Williston, Vt.

[73] Assignee: International Business Machines Corporation, Armonk, N.Y.

[21] Appl. No.: 563,415

[22] Filed: Nov. 28, 1995

[51] Int. Cl.$^6$ .................. H03L 7/08; H03L 7/16
[52] U.S. Cl. .................. 327/147; 327/141; 327/150; 327/156; 327/159
[58] Field of Search .................. 327/115–117, 119–122, 327/144–150, 155–159, 141; 377/47, 48

[56] References Cited

U.S. PATENT DOCUMENTS

| | | | |
|---|---|---|---|
| 3,970,954 | 7/1976 | Even | 327/116 |
| 3,993,957 | 11/1976 | Davenport | 327/115 |
| 4,053,839 | 10/1977 | Knoedl, Jr. | 377/47 |
| 4,405,898 | 9/1983 | Flemming | 327/145 |
| 4,598,257 | 7/1986 | Southard | 331/2 |
| 4,663,541 | 5/1987 | Larrowe | 327/237 |
| 4,725,786 | 2/1988 | Papaieck | 327/114 |
| 4,845,437 | 7/1989 | Mansur et al. | 327/114 |
| 5,059,924 | 10/1991 | JenningsCheck | 331/1 A |
| 5,077,686 | 12/1991 | Rubinstein | 377/47 |
| 5,175,731 | 12/1992 | Suarez | 370/85.6 |
| 5,179,667 | 1/1993 | Iyer | 395/494 |
| 5,208,838 | 5/1993 | Wendell et al. | 327/114 |
| 5,230,041 | 7/1993 | Dinwiddle, Jr. et al. | 395/162 |
| 5,241,543 | 8/1993 | Amada et al. | 370/100.1 |
| 5,245,322 | 9/1993 | Dinwiddie, Jr. et al. | 345/115 |
| 5,281,863 | 1/1994 | Bond et al. | 327/114 |
| 5,361,367 | 11/1994 | Fijany et al. | 395/800 |
| 5,365,119 | 11/1994 | Kivari | 327/115 |
| 5,378,935 | 1/1995 | Korhonen et al. | 327/114 |
| 5,389,830 | 2/1995 | Buckingham et al. | 327/116 |
| 5,394,114 | 2/1995 | Davis | 327/116 |
| 5,485,127 | 1/1996 | Bertoluzzi et al. | 331/69 |
| 5,537,068 | 7/1996 | Konno | 327/115 |
| 5,544,203 | 8/1996 | Casasanta et al. | 327/150 |
| 5,548,249 | 8/1996 | Sumita et al. | 331/1 A |

*Primary Examiner*—Timothy P. Callahan
*Assistant Examiner*—T. T. Lam
*Attorney, Agent, or Firm*—Whitham, Curtis, Whitham & McGinn; Tiffany L. Townsend

[57] ABSTRACT

A circuit for synchronizing a multiplied system clock signal includes a device for generating a system clock signal, a first device that receives the system clock signal and generates a synchronization signal and at least one second device that receives the system clock signal and the synchronization signal. Each of the second devices includes a device for multiplying the system clock signal to produce the multiplied system clock signal and a device for synchronizing the multiplied system clock signal with each other multiplied system clock signal produced by the other second devices based on the synchronization signal.

10 Claims, 6 Drawing Sheets

CLOCK SYNCHRONIZATION SCHEME FOR FRACTIONAL MULTIPLICATION SYSTEMS

BACKGROUND OF THE INVENTION

1. Field of the Invention

The present invention generally relates to digital electronic systems and, more particularly, to the synchronization of high frequency clock pulses to portions of such digital electronic systems.

2. Description of the Related Art

The performance and correct operation of complex digital circuits is critically dependent upon the timing of the signals propagated through the numerous signal paths therein. For example, even with a simple logic gate for receiving a plurality of inputs, if the arrival times of the inputs are skewed, the correct output will be produced only during the overlap, if any, of the correct logic states of the input signals. Thus, the operation of digital circuits is periodically re-clocked at intervals referred to as a "cycle time".

Cycle time is usually determined by a system clock which produces clock signals of different phases to allow for signal propagation and settling times so that all signals are in an intended logic state when the various digital circuits are permitted to respond thereto. However, since the cycle times must accommodate all propagation delays and other signal distortion and settling times within the system, the clock cycle must often accommodate the largest delay therein. Thus, the cycle time of the largest delay element imposes its delay on the entire system and thereby limits the operational speed of the entire system.

Noise and signal propagation delay are minimized by designing the system master oscillator to run at the lowest frequency that synchronous distribution permits, in view of the desired system speed. Hence, local high speed clocks must receive a synchronizing signal from a system synchronizing means at a minimum frequency or maximum interval depending on the required accuracy of system synchronization. To maintain accuracy of system synchronization, the minimum frequency of the synchronization signal must be increased with the increasing local, high speed clock rate.

Recently, clock multiplier circuits have been added to microprocessors to generate an internal clock signal that is a multiple of the external "system" clock speed. Such an internal clock signal allows the microprocessor to operate at very high internal speeds, even though the system bus and system clock are running at a slower speed. If the microprocessor must communicate with one or more devices (i.e., peripherals, input/output buses, storage devices, etc.) at the speed of its internal clock, the second device must generate, or receive, the higher speed clock signal in order to communicate at that speed.

However, a problem exists when two or more devices operate at fractional (non-integer) clock-multiplied speeds (i.e., 1.5×, 2.5×, 3.5×, etc.) because they cannot properly communicate unless the fractionally multiplied clock signal is synchronized with the other devices. Therefore, unless the devices are "phase-locked" correctly they cannot communicate effectively.

To synchronize the internal clock signals of devices that are to communicate, the problem referred to as "meta-stability" must be overcome. In other words, the communication can only effectively take place after logic signals have stabilized. Meta-stability is essential to proper communication because synchronized timing is critical to circuit relationships and communication. In other words, output drivers in communication devices can take a finite time to change from a zero to a one and latch circuits or registers must know when the data level is stable so that the correct data can be captured. Therefore, the out-of-phase clock problem impacts the delay that occurs while various circuits are waiting for the synchronization of the logic signals. This period of delay is undesirable and its elimination/reduction has been a long felt need that this invention answers.

One solution to the out-of-phase clock problem involves a "master" device issuing a fractionally multiplied clock signal to "slave" devices. This ensures that all slave devices will be in phase with the master. However, when one device acts as a master and generates a higher speed clock to be sent to slave devices, sending and receiving the generated clock signal causes delays because of signal distribution and bandwidth problems. These delays impact performance parameters such as set-up and hold times for the interface signals.

Delays associated with master/slave relationships are eliminated when each slave device generates its own internal clock. However, when each device generates its own fractionally multiplied clock signal, there is no assurance that the clock signal will be in phase with the other logic signals.

Specifically, the out-of-phase clock problem is illustrated as follows. If the internal clock speed is an integer multiple (i.e. 1×, 2×, 3×, etc.) of the "system" clock, each device will generate an identical internal clock signal synchronized with the other internal clock signals. However, if the internal clock speed is a fractional (non-integer) multiple (i.e., 1.5×, 2.5×, 3.5×, etc.) of the "system" clock, one device's internal clock may be completely (180°) out of phase with other devices' internal clocks.

The out-of-phase clock problem is further illustrated in the drawings. Referring now to FIG. 1, exemplary waveforms of a system clock signal 10 ("CLK") is shown.

The waveform is initially at a "low" signal level (i.e., "0") and at t0 goes to a "high" signal level (i.e., "1"). At the midpoint between t0 and t1, the system clock signal returns to the low signal level. At t1, the system clock signal repeats this cycle by returning to a high signal level. This cycle is continuously repeated each time unit.

FIG. 1 shows the waveform of internal clock signals of a device A, which is referred to as the signal CLK A (11). FIG. 1 shows the waveform of internal clock of a device B, which is referred to as the signal CLK B (12). FIG. 1 also shows the waveform of internal clock of a device C, which is referred to as the signal CLK C (13). Each of the internal devices A, B and C produces its own internal clock signal, based on the system clock signal. In this example, each of the internal clock signals is a non-integer multiple (i.e., 1.5×) of the system clock signal.

Clock signals CLK A and CLK C are substantially synchronous.

Device B's internal clock signal 12 is also running at 1.5× of the system clock signal, but unlike CLK A and CLK C, whenever CLK A and CLK C change from a low to a high state, CLK B performs the opposite action. Thus, internal CLK B is completely out of phase, or 180° out of phase, with internal CLK A and internal CLK C.

As explained above, since CLK B is out of phase with CLK A and CLK C, communications between the devices will be inefficient, if not impossible. This invention solves the out-of-phase clock problem by synchronizing the fractionally multiplied clock signals that are produced by the individual devices.

SUMMARY OF THE INVENTION

It is therefore an object of the present invention to provide a solution to the out-of-phase clock problem of the above-mentioned conventional device.

It is another object to solve the above-mentioned problem by introducing a synchronization signal that synchronizes the internal clock signals of a plurality of devices where internal clocks which are a fractional multiple of the system clock are put in phase.

Yet another object of the invention is to provide a system and method for synchronizing internal clock signals of various devices that multiply a system clock signal by a fractional amount. The present invention incorporates a synchronization signal to maintain all fractionally multiplied individual clock signals in phase and at a consistent frequency.

Specifically, in a first aspect of the invention, an apparatus is provided which includes a circuit for multiplying a system clock signal. The circuit includes a system clock bus for transmitting the system clock signal, a master device connected to the system clock bus, for generating a synchronization signal, and a plurality of slave devices connected to the system clock bus and the synchronization signal from the master device. Each of the plurality of slave devices includes a device clock, the device clock is connected to a clock tree distribution circuit and a feedback divider circuit.

By using a "master" generated synchronizing signal broadcast to other "slave" devices, the synchronizing signal is available as soon as the clock signal becomes active. This allows phase-locked-loop devices to immediately begin "locking-in" on the correct internal clock phase.

This synchronizing scheme also allows an entire clock-multiplied system (e.g., a "master" with one or more "slave" devices) to be added to an existing bus, without any required changes (i.e., synchronizing bus cycle, additional signals, etc.). These attributes are required in cases where "backward compatibility" does not allow any changes, and is also useful for a "plug-and-play" application where a special bus cycle for synchronization is impractical.

Thus, according to the invention, a synchronization signal is introduced which synchronizes the internal clock signals of a plurality of devices where internal clocks which are a fractional multiple of the system clock are put in phase. The inventive structure and method synchronize fractionally multiplied internal clock signals of various devices and, more specifically, employ the synchronization signal and a phase-locked-loop to maintain all fractionally multiplied individual clock signals in phase and at a consistent frequency.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF A PREFERRED EMBODIMENT OF THE INVENTION

The present invention is directed to a system which utilizes a synchronization signal, generated by a master unit, that is broadcast over a synchronization signal bus. The synchronization signal is used by individual slave devices to generate fractionally multiplied clock signals that are in phase and synchronized with the other fractionally multiplied clock signals.

Figure 3:
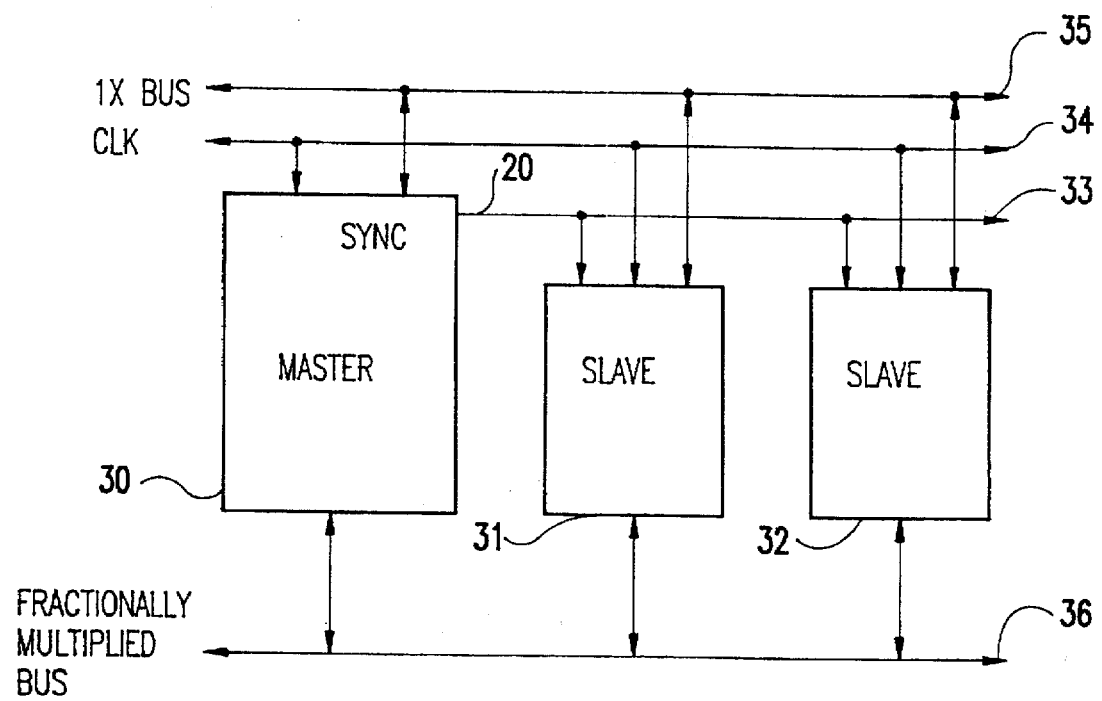
FIG. 3 is a block diagram of a system according to the present invention including a master clock synchronization signal generator, slave devices, a system clock bus and a fractionally multiplied bus.

The present invention, as shown in FIG. 3 and discussed in more detail below, is superior to conventional systems because the present invention eliminates delay and does not interfere with the communication line or bus. Specifically, as discussed in the Background section, some prior art systems distribute a high speed clock signal directly, which adds the requirement of providing this additional clock signal to all of the devices that communicate at the fractionally multiplied clock speed. Other prior art solutions introduce a special bus cycle operation as a means for establishing synchronization of internally generated multiplied clock signals among the devices that communicate at the fractionally multiplied clock speed.

Conversely, the present invention allows synchronization to be established between all clock signals at any time and without any interruption of or need to establish control over the communication bus. Therefore, the present invention is applicable to situations where cards are plugged in "on the fly" Further, with the present invention there is no need to reboot or execute a special bus cycle when a new device is installed or connected, which is required in prior art systems.

While the present invention is described with respect to chip-to-chip communications, below, it is equally applicable to card-to-motherboard communications. This is especially true where it is advantageous to have the ability to plug cards into a motherboard "on the fly", without rebooting or performing a special initialization cycle. Further, the synchronization scheme according to the present invention synchronizes the divergent clock signals more quickly than prior art systems, as described below.

Specifically, FIG. 3 is a block diagram showing a preferred embodiment of the invention in which a first device 30 acts as a "master" and second and third devices 31 and 32, respectively, serve as "slaves" to the "master".

Master 30 generates SYNC signal 20 using a divider circuit known to those skilled in the art. Slave devices 31, 32 receive the SYNC signal 20 from device 30 for synchronizing their respective internal clocks. Specifically, FIG. 3 shows a SYNC bus 33 that carries the SYNC signal 20 to device 31, device 32 and other slave devices (not shown) connected to SYNC bus 33.

As shown in FIG. 3, each of the slave devices communicates to and from the bus 35 to transfer data and perform other operations related to the slave device's primary execution function. The bus 35 communicates at the same speed as the CLK signal 10. In the exemplary embodiment, the preferred speed of the bus 35 is 66 MHZ. However, any speed can be utilized according to the designer's needs and system configuration.

Each of the slave devices may also communicate to and from the fractionally multiplied bus 36. The fractionally multiplied bus operates at some specific integer or non-integer multiple of the CLK signal 10. For example, the fractionally multiplied bus may operate at a speed of 1.5×, 2.5×, or 3.5× of the CLK signal 10. This specific embodiment is concerned with situations where the fractionally multiplied bus 36 is operating at a signal frequency that is a half-integer multiple (i.e., 1.5×, 2.5×, 3.5×, etc.) of the CLK signal 10, but the invention includes other fractional multiples. Therefore, each of the slave devices may communicate with both the 1× bus and the fractionally multiplied bus that are operating at different frequencies.

To allow devices 31, 32 to communicate with the 1× bus 35, the CLK signal 10 is input to the devices from the CLK bus 34. Since the CLK signal 10 and the 1× bus 35 operate at the same frequency and are in phase, no synchronization is necessary.

To allow device 31 and device 32 to communicate with the fractionally multiplied bus 36, the CLK signal 10 must be multiplied by a predetermined amount. In the exemplary embodiment, the CLK signal 10 is multiplied by a half-integer amount (i.e., 1.5×, 2.5×, 3.5×, etc). As discussed above, the internal fractionally multiplied device clock signal may be out of phase with the bus or other devices.

To ensure all internal, fractionally multiplied devices are operating in phase with each other, the SYNC signal 20 is used in conjunction with the CLK signal 10, to establish the phase relationship of the internal fractionally multiplied clock, with respect to the CLK 10 signal. This function is explained in further detail below.

Figure 1:
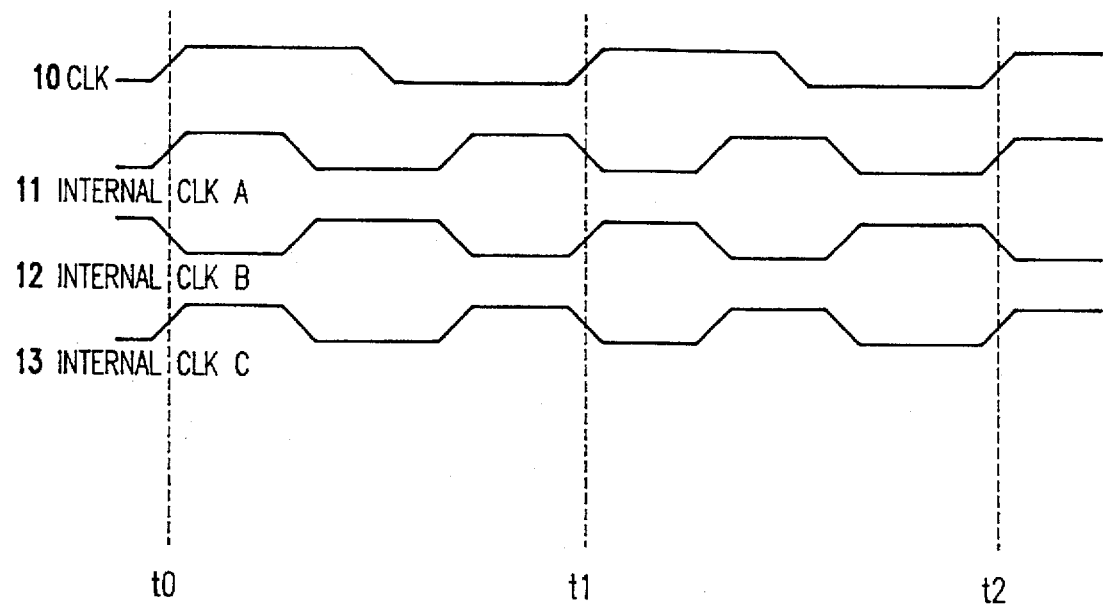
FIG. 1 illustrates exemplary waveforms of a system clock signal and accelerated internal clock signal, in an exemplary system.
Figure 2:
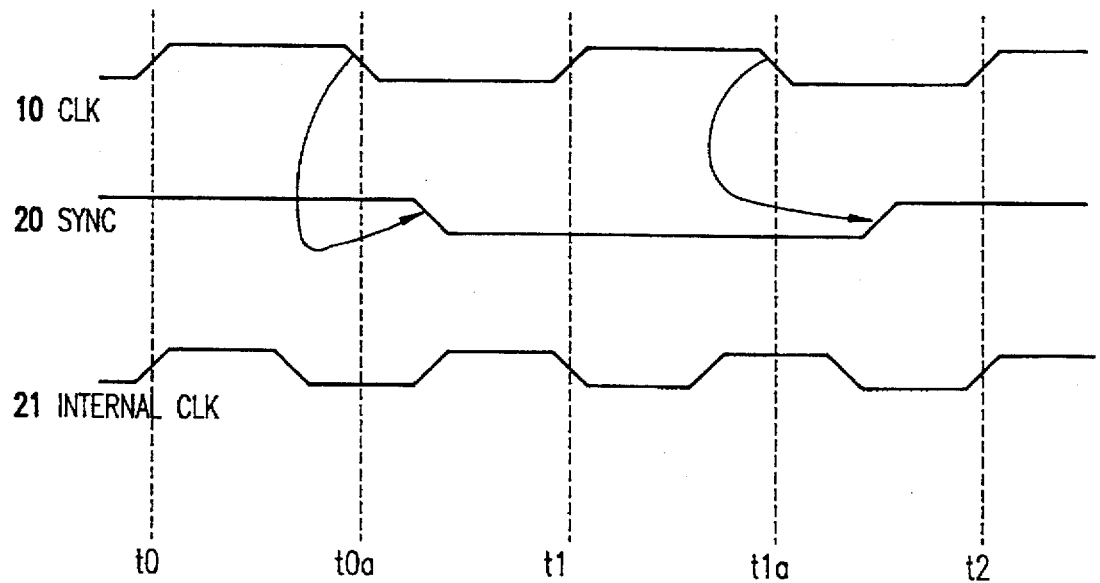
FIG. 2 illustrates exemplary waveforms of a system clock signal, a 1.5× multiplied internal clock signal and a synchronization signal, according to the present invention.

FIG. 2 illustrates a synchronization signal 20 ("SYNC"). For systems employing half-integer clock multiplication schemes (e.g., 1.5×), the SYNC signal is a divided-by-two version of the CLK signal. For other fractional clock multiplication schemes, the SYNC signal would be some other divided version of the input clock, as would be known by the ordinary skilled artisan within the purview of the present application.

The example described herein is for 1.5× clock multiplying systems.

In the exemplary system, the SYNC signal 20 is "high" (i.e., "1") at t0 and CLK signal 10 is rising from a "low" level to a "high" level. Just after the CLK signal 10 goes from a high level to a low level at t0a, SYNC signal 20 goes from the high level to a low level (i.e., "0").

The SYNC signal 20 remains low until just after t1a. At t1a, the CLK signal 10 transitions from a high signal to a low signal. Just after the CLK signal 10 changes to a low signal, the SYNC signal 20 transitions from a low signal back to a high signal.

The synchronization signal 20 makes a transition after the fall of the system clock signal so that the SYNC signal is high for every other high system clock signal. In this way, SYNC signal acts as an enable for every other positive CLK pulse.

Providing the SYNC signal 20 allows a specific protocol (e.g., relationship) to be established between the CLK signal 10 signal and the fractionally multiplied internal device clock signal 21 ("internal CLK").

The protocol established for this example is as follows. When the SYNC 20 is high at the rising edge of the CLK signal 10 (i.e., when CLK signal 10 is going from a low signal to a high signal), the internal CLK 21 must also be rising. If internal CLK 21 is falling at this point, it is out of phase and must be corrected so as to be in phase by being shifted 180°. Conversely, when the SYNC signal 20 is low at the rising edge of the CLK signal 10, the internal CLK 21 must be falling. If internal CLK 21 is rising at this point, it is out of phase and must be corrected so as to be in phase by being shifted 180°.

Thus, the SYNC signal 20 is for establishing an arbitrary protocol to determine whether all the internal CLK 21 signals of each of the various internal devices are synchronized (e.g., in phase with each other). Such synchronization of each of the internal devices allows communications between the devices to be highly efficient and also increases the processing speed of the overall system.

Phase-locked loops (PLLs) are commonly used to synchronize clock signals. Basically, a phase-locked loop is a device used to control the frequency of a local oscillator such that the frequency thereof will follow variations in frequency of another signal.

A phase-locked loop allows "locking on" to a signal close to that of the oscillator or a harmonic or sub-harmonic thereof, depending on the structure of the PLL. Therefore, PLLs are somewhat self-tuning, exhibit particularly good noise immunity and are used to recover a synchronization signal.

A PLL essentially includes a variable frequency oscillator (e.g., typically a VCO) and a phase detector. The phase detector receives both an input signal and an output signal from the oscillator.

Either the feedback signal or the input signal may be frequency-divided depending on whether the PLL oscillator is to operate at a multiple (e.g., harmonic) or sub-multiple (e.g., sub-harmonic) of the input signal.

The phase detector compares the phase of the input signal and the feedback signal and generates a signal voltage) having an amplitude corresponding to the phase error detected therebetween to control the oscillation frequency of the variable frequency oscillator. The output of the phase detector may be advantageously filtered by a low pass-filter to smooth the error signal and thus to stabilize the operation of the VCO.

Figure 4:
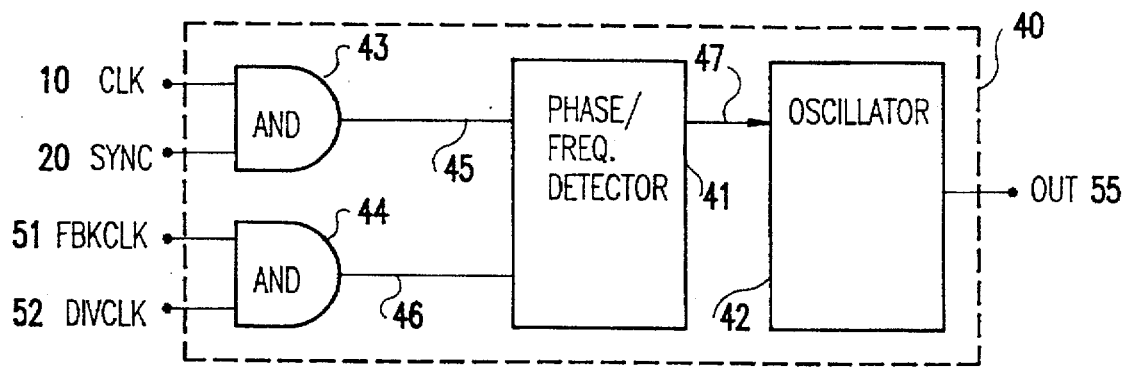
FIG. 4 is a block diagram of a phased-locked loop (PLL) circuit for use with the system according to the present invention.

FIG. 4 shows a block diagram of a multiplied clock generator 40 as used in the present invention. The prior art PLL has been modified to include pertinent elements for the clock synchronization of the present invention. As shown in FIG. 4, the multiplied clock generator circuit 40 includes a phase/frequency detector 41 and an oscillator 42 for outputting an internal multiplied clock signal 55. This multiplied clock signal 55 is used to communicate on the multiplied CLK bus 36.

The phase/frequency detector 41 is a commonly known hardware element for comparing, in this case, the rising edges of two signals (e.g., an external reference clock signal 10 and an on-chip clock signal 51), and for producing control signals that will then increase or decrease the speed of the oscillator until the frequency and phase of the two inputs are identical.

In FIG. 4, a first AND circuit 43 receives the CLK signal 10 from the CLK bus 34 and the SYNC signal 20 from the SYNC bus 33, as described above.

AND circuit 43 operates according to the operations or "protocol" established above. In this protocol, AND circuit 43 detects the conditions of the SYNC signal 20 being high (i.e., "1") and the CLK 10 signal having a rising edge (i.e. going from a low level ("0") signal to a high level ("1") signal). When these conditions are both present, the AND circuit 43 outputs a signal 45 to the phase/frequency detector 41. This operation is shown graphically in FIG. 6 and is discussed in detail below.

A second AND circuit 44 performs a similar function and receives an internal clock feedback "FBKCLK" signal 51, which, as discussed below, is a representative output of the clock tree distribution circuit 56. AND circuit 44 also receives a divided clock signal 52 "DIVCLK" which, as also discussed below, is the internal multiplied clock signal 54 which has been divided by a predetermined number. Signal 54 is divided according to the established multiplication factor.

AND circuit 44 follows a similar protocol as that established above and detects the conditions of the DIVCLK signal 52 being high (i.e. "1") and the FBKCLK 51 having a rising edge (i.e., going from a low ("0") signal to a high ("1") signal). When these conditions are both present, AND circuit 44 outputs a signal 46, to the phase/frequency detector 41. This operation is also shown graphically in FIG. 6 and is discussed below.

The polarity of the correction output voltage signal 47 is determined by which input signal (signal 45 vs. signal 46) rises first, and the magnitude of the correction output voltage signal 47 is determined by the amount of time elapsed between the two rising edges.

The phase/frequency detector compares the rising edges of the signals 45 and 46 to determine whether the frequency of the oscillator 42 needs to be increased or decreased. If the rising edge of signal 45 occurs before the rising edge of signal 46 then the phase/frequency detector will produce a control signal 47 that causes the oscillator to increase in frequency.

Similarly, if the rising edge of signal 45 occurs after the rising edge of signal 46, then the phase/frequency detector will produce a control signal 47 that causes the oscillator to decrease in frequency.

The timing relationship between signals 45 and 46 is the same as the timing relationship between signals CLK 10 and FBKCLK 51, since both are delayed by one AND gate delay. By comparing the period when SYNC signal 20 is high to the period when CLK signal 10 is high, a rising edge of the CLK signal is selected for use by the phase/frequency detector. For 1.5× clock multiplication, the SYNC signal envelops every other rising CLK signal.

Similarly, by comparing the period when DIVCLK signal 52 is high to the period when FBKCLK signal 51 is high, a rising edge of the FBKCLK signal is selected for use by the phase/frequency detector. For 1.5× clock multiplication, the DIVCLK signal envelops every third rising FBKCLK signal.

Figure 5:
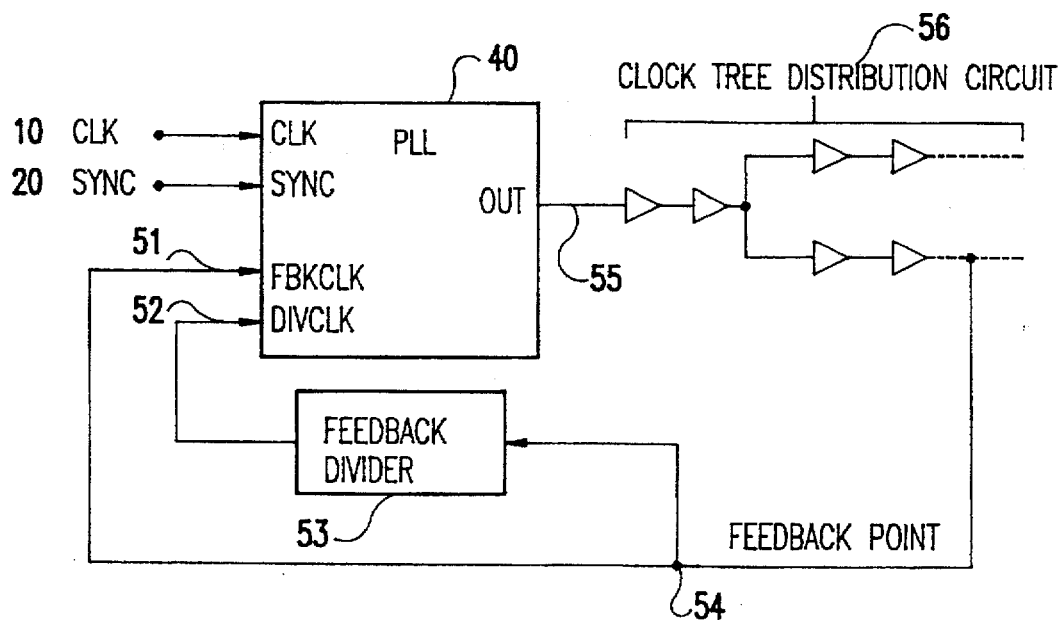
FIG. 5 is a block diagram of a clock architecture including a PLL and a feedback divider according to the present invention.

Turning to FIG. 5, the multiplied clock generator circuit 40 has, as shown above, inputs from the CLK bus 34 and the SYNC bus 33 of FIG. 3. FIG. 5 illustrates, in detail, a feedback divider 53 and the output internal multiplied clock signal 55.

The output signal 55 of the multiplied clock generator circuit 40 is distributed across the chip via the clock tree distribution circuit 56. Preferably, the clock tree distribution circuit 56 includes a plurality of driver circuits, whose fan-out and number of stages is designed to suit the requirements of whatever devices are implemented in a specific application. A representative feedback point 54 is chosen for the "feedback" signal to be used by the multiplied clock generator circuit 40 for phase alignment (as well as frequency control).

The feedback divider circuit 53 is a portion of the clock multiplication scheme and preferably includes latch circuits acting as counters for allowing a plurality of programmable division factors.

Figure 6:
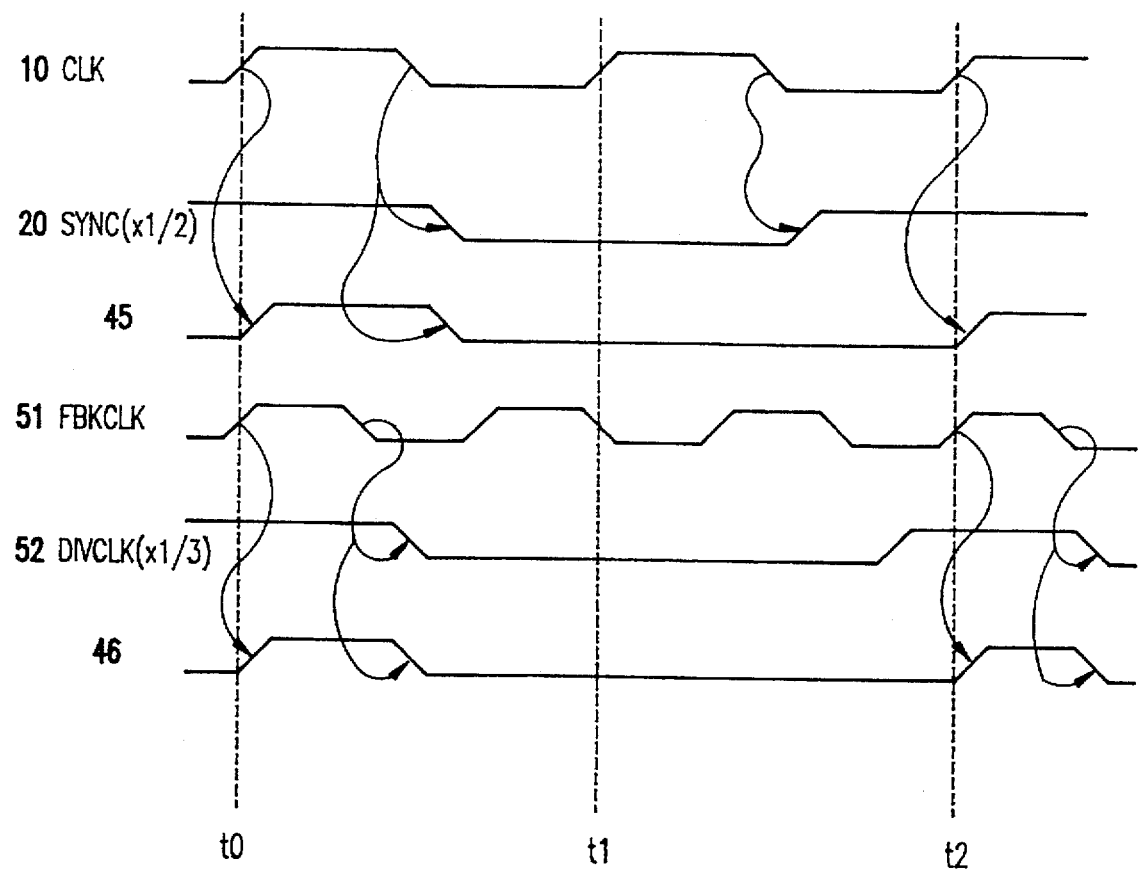
FIG. 6 is a timing diagram indicating exemplary waveforms for the PLL phase/frequency detector including a system clock signal, a synchronization signal, two internal signals, a feedback clock signal and a divided clock signal, according to the present invention.

FIG. 6 illustrates the protocol discussed with respect to the circuit shown in FIG. 4 and more specifically the function of the AND circuit 43 and AND circuit 44 as they relate to the above signals. The waveforms shown in FIG. 6 are for the circuit shown in FIGS. 4 and 5 while the circuit is performing a 1.5× system clock multiplication.

With the SYNC signal 20 defined as a divided-by-two version of the CLK signal 10, the output of AND circuit 43, shown in FIG. 4 as signal 45, is a pulse that occurs on every other rising edge of the CLK signal 10, delayed by one AND-gate delay. This occurs because the AND circuit 43 is operating according to the protocol, discussed with respect to FIG. 4.

Specifically, the protocol requires that when the SYNC 20 is high at the rising edge of the CLK 10 (i.e., when CLK 10 is going from a low signal to a high signal), the internal CLK 21 will also be rising. AND 43 detects the conditions of the SYNC signal 20 being high (i.e., "1") and the CLK 10 having a rising edge (i.e., going from a low ("0") signal to a high ("1") signal). When these conditions are both present, the AND circuit 43 outputs a signal 45 to the phase/frequency detector 41. This signal is shown graphically as waveform 45 in FIG. 6.

Thus, the operations of AND circuit 44 are shown graphically as waveform 46 in FIG. 6. The DIVCLK signal 52 is the output of the feedback divider circuit 53 which divides the internal multiplied clock signal 55 by a factor of 3. Signal 46 is the output of the AND gate 44 shown in FIG. 4, and occurs one AND-gate delay after every third rising edge of the PLL-generated internal multiplied clock signal 55. These two edges are compared by the phase/frequency detector to control the PLL oscillator, and results in three internal clock cycles being generated for every two CLK 10 cycles, or a 1.5× clock multiplication. If the feedback divider circuit 53 is configured to perform a divide-by-five operation, the result would be a 2.5× clock multiplication.

The multiplication factor is a function of the frequency of the synchronization signal and the frequency of the divided feedback signal. Specifically, the multiplication factor is the fraction where the numerator is the division factor within the feedback divider and the denominator is the division factor of the synchronization signal with respect to the system clock signal.

If the SYNC signal is set high continually, then signal 45 will track the CLK input exactly, and as such, represents a divided-by-1 version of the input CLK. Similarly, if the DIVCLK signal is held high, then signal 46 will track the FBKCLK signal exactly, and as such, represents a divided-by-1 version of the FBKCLK. With the SYNC signal held high, integer clock multiplication (1×, 2×, 3×, etc.) is possible.

In the above example, the numerator is 3 (e.g., the division factor within the feedback loop), and the denominator is 2 (e.g., the amount the system clock signal is divided to produce the synchronization signal). Therefore, 3 divided by 2 results in a 1.5 multiplication of the system clock signal.

Figure 7:
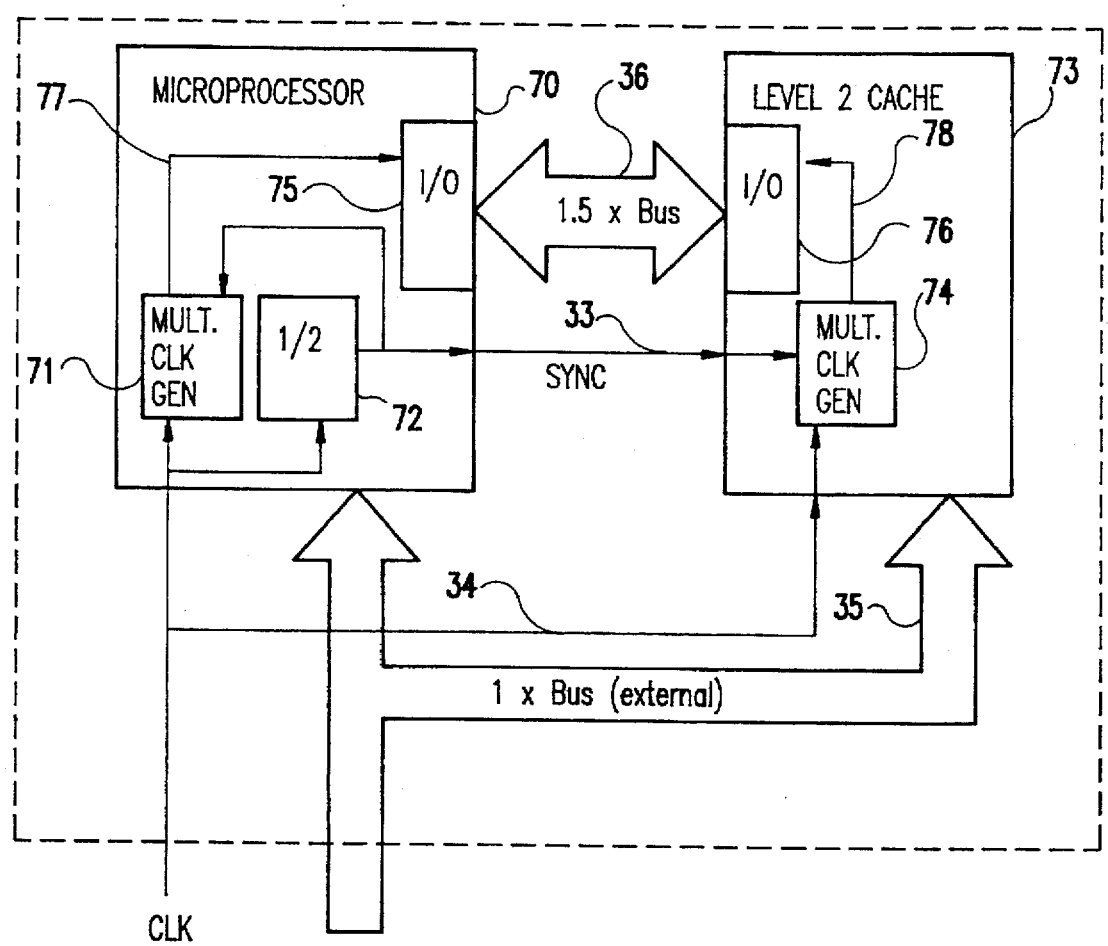
FIG. 7 is a block diagram showing an unmultiplied bus and a fractionally multiplied bus communicating with a microprocessor and a level 2 cache according to the present invention.

FIG. 7 illustrates a preferred system embodiment of the invention. A microprocessor 70 and level 2 cache 73 are both connected to a common 1× bus 35 with CLK signal 10 on the clock bus 34. In this embodiment this bus operates at 66 MHz, and may be connected to other devices (not shown) that use a standardized Intel protocol for this bus.

In order to improve performance, devices that communicate on the common bus 35 have internal clock circuitry to multiply the external clock signal 10 to a higher internal 1.5× speed of 100 MHZ. This allows internal circuits to operate at a much higher rate. PLL circuits are ideal for this purpose. FIG. 4 depicts PLL elements used in conjunction with AND gates to implement the multiplied clock generator 40 applied in FIG. 7 as elements 71 and 74. The multiplied clock output from the generators 71 and 74 is distributed across the microprocessor and the level 2 cache by clock lines 77 and 78 respectively. The clock lines also distribute the multiplied clock signal to their respective I/O blocks 75 and 76 so as to allow higher speed communications on the higher speed, 100 MHZ, 1.5×, fractionally multiplied bus 36.

In order for the microprocessor 70 to communicate with the level 2 cache 73 at a clock-multiplied rate of 1.5× on bus 36, the internal clocks of both devices need to be synchronized with each other for the communication to be valid. In this embodiment, the microprocessor is chosen to be a "master" device, and includes divide-by-two circuitry 72 to produce a synchronizing signal 20 which is sent internally to the microprocessor's own multiplied clock generator 71, as well as externally via sync line 30 to the cache device's multiplied clock generator 74. Both multiplied clock generator circuits 71 and 74 use the external clock signal 10 and the sync signal (20) in the same manner, so that the resulting internally generated multiplied clocks are identical in frequency and phase. Both the microprocessor and the level 2 cache operate with their internal high speed clocks in phase with each other and, therefore, reliable communication between them on bus 36 can occur at the faster fractionally multiplied clock speed.

Figure 8:
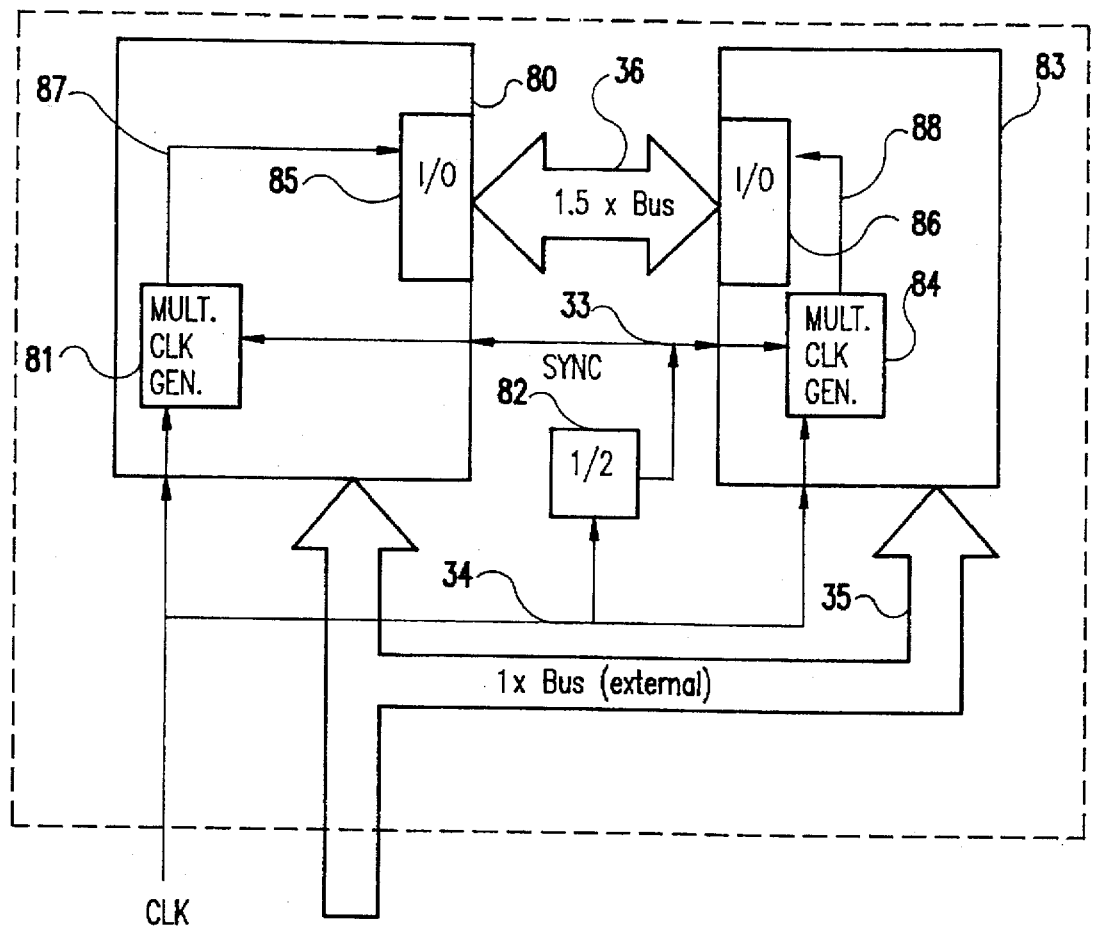
FIG. 8 is similar to FIG. 7 and shows a separate divided-by-two circuit.

FIG. 8 illustrates another embodiment similar to FIG. 7 that includes the divide-by-two circuitry 82 as an external circuit to the devices 80 and 83. Therefore, in the embodiment shown in FIG. 8, there is no "master" device. Specifically, FIG. 8 illustrates a 1× external clock bus 35 which supplies an unmultiplied clock signal to devices 80 and 83. Each device 80 and 83 includes a multiplied clock generator circuit 81 and 84 which multiply and synchronize the clock signal based on the sync signal 33 and the clock signal 34, as discussed above. The multiplied clock signals 87 and 88 are supplied to the I/O blocks 85 and 86 which can then communicate on the higher speed bus 36.

In sum, by using a "master" generated synchronizing signal broadcast to other "slave" devices in the invention, the synchronizing signal is available as soon as the CLK signal becomes active. This allows phase-locked-loop devices to immediately begin "locking-in" on the correct internal clock phase. This synchronizing scheme also allows an entire clock-multiplied system (e.g., a "master" with one or more "slave" devices) to be added to an existing bus, without any required changes (i.e., synchronizing bus cycle, additional signals, etc.). These attributes are required in cases where "backward compatibility" does not allow any changes, and is also useful for a "plug-and-play" application where a special bus cycle for synchronization is impractical.

While the embodiment above has been illustrated with the specific structure of the appended Figures, as would be known by the ordinary skilled artisan within the purview of this application, this invention is applicable to any set of clocked devices that perform internal clock multiplication at fractional multiplication factors that need to communicate with each other at the multiplied speed.

Thus, while the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A circuit for synchronizing a multiplied system clock signal, comprising:

means for generating a system clock signal;

a first device, operatively connected to said generating means, for receiving said system clock signal, and for generating a synchronization signal; and a plurality of second devices, operatively connected to said generating means and said first device, for receiving said system clock signal and said synchronization signal, each of said second devices including a multiplied clock generator circuit for outputting said multiplied system clock signal and for synchronizing said multiplied system clock signal with said system clock signal, such that each said multiplied system clock signal produced by one of said second devices is synchronized and in phase with other multiplied system clock signals produced by other ones of said second devices, wherein said multiplied system clock signal comprises a non-integer fractional multiple of said system clock signal, wherein said multiplied clock generator circuit comprises: first and second logic circuits;
a phase/frequency detector circuit coupled to each of said first and second logic circuits; and
an oscillator circuit for receiving an output of said phase/frequency detector circuit, said oscillator circuit including means for outputting said multiplied system clock signal.

2. A circuit as in claim 1, further comprising:

a clock tree distribution circuit, operatively connected to said multiplied clock generator circuit, for outputting a feedback clock signal.

3. A circuit as in claim 2, further comprising:

a divider circuit operatively connected to said multiplied clock generator circuit, wherein said divider circuit includes means for dividing said feedback clock signal and means for outputting a divided feedback clock signal to said multiplied clock generator circuit.

4. A circuit as in claim 3, wherein said first logic circuit includes means for comparing said system clock signal and said synchronization signal and means for outputting a first pulse when said system clock signal has a predetermined state and said synchronization signal has said predetermined state, and said second logic circuit including means for comparing said divided feedback clock signal and said multiplied system clock signal and means for outputting a second pulse when said divided feedback clock signal has said predetermined state and said multiplied system clock signal has said predetermined state.

5. A circuit as in claim 4, wherein said phase/frequency detector circuit includes means for comparing said first pulse and said second pulse and means for controlling said oscillator circuit so that said first pulse and said second pulse are produced substantially simultaneously and said multiplied system clock signal is synchronized with said other multiplied system clock signals of said others of said second devices.

6. A circuit as in claim 1, wherein said first and second logic circuits each comprise an AND circuit.

7. A circuit as in claim 1, wherein said multiplied clock generator circuit further comprises a low pass-filter operatively connected to said oscillator circuit and said phase/frequency detector circuit.

8. A circuit as in claim 3, wherein said divider circuit further comprises a plurality of latch circuits, wherein said divider circuit performs a plurality of division operations on said feedback clock signal.

9. A circuit for synchronizing a multiplied system clock signal comprising:

means for generating a system clock signal;

a first device, operatively connected to said generating means for receiving said system clock signal and for generating a synchronization signal; and a plurality of second devices, operatively connected to said generating means and said first device, for receiving said system clock signal and said synchronization signal, each of said second devices including a multiplied clock generator circuit for outputting said multiplied system clock signal and for synchronizing said multiplied system clock signal with said system clock signal, such that each said multiplied system clock signal produced by one or said second devices is synchronized and in phase with other multiplied system clock signals produced by other ones of said second devices, wherein said multiplied system clock signal comprises a non-integer fractional multiple of said system clock signal, wherein said first device comprises a second multiplied clock generator circuit including:

third and fourth logic circuits;

a second phase/frequency detector circuit coupled to each of said third and fourth logic circuits; and a second oscillator circuit for receiving an output of said second phase/frequency detector circuit.

10. A circuit as in claim 1, wherein said non-integer fractional multiple comprises a number greater than one.

* * * * *

UNITED STATES PATENT AND TRADEMARK OFFICE
CERTIFICATE OF CORRECTION

PATENT NO.: 5,691,660
DATED: November 25, 1997
INVENTORS: Robert E. Busch, Kenneth M. Zick, Robert M. Houle It is certified that error appears in the above-identified patent and that said Letters Patent is hereby corrected as shown below.

On the title page under Attorney, Agent, or Firm, please delete "Tiffany L. Townsend".

Signed and Sealed this

Tenth Day of February, 1998

Attest:

BRUCE LEHMAN

Attesting Officer      Commissioner of Patents and Trademarks